United States Patent
Kuhn et al.

(10) Patent No.: US 6,344,085 B2
(45) Date of Patent: Feb. 5, 2002

(54) DEVICE AND METHOD FOR PRODUCING AT LEAST ONE SIC SINGLE CRYSTAL

(75) Inventors: Harald Kuhn, Erlangen; Roland Rupp, Lauf; Rene Stein, Röttenbach; Johannes Völkl, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/761,809

(22) Filed: Jan. 16, 2001

Related U.S. Application Data

(63) Continuation of application No. PCT/DE99/02066, filed on Jul. 5, 1999.

(30) Foreign Application Priority Data

Jul. 14, 1998 (DE) .......................................... 198 31 556

(51) Int. Cl.⁷ .............................................. C30B 35/00
(52) U.S. Cl. ..................................... 117/223; 117/951
(58) Field of Search ................................ 117/206, 223, 117/951

(56) References Cited

U.S. PATENT DOCUMENTS

| | | | |
|---|---|---|---|
| 5,045,398 A | * 9/1991 | Levin | 428/446 |
| 5,108,729 A | * 4/1992 | Gerhold et al. | 423/346 |
| 5,667,587 A | 9/1997 | Glass et al. | |
| 5,683,507 A | 11/1997 | Barrett et al. | |
| 5,989,340 A | * 11/1999 | Stephani et al. | 117/204 |
| 6,214,108 B1 | * 4/2001 | Okamoto et al. | 117/95 |

FOREIGN PATENT DOCUMENTS

| | | |
|---|---|---|
| DE | 4310745 A1 | 10/1994 |
| SU | 882247 | 7/1980 |

OTHER PUBLICATIONS

"Formation of macrodefects in SiC", R.A. Stein, Physica B 185, 1993, pp. 211–216.
Published International Application No. 94/23096 (Völkl et al.), dated Oct. 13, 1994.

* cited by examiner

*Primary Examiner*—Benjamin L. Utech
*Assistant Examiner*—Matthew Anderson
(74) *Attorney, Agent, or Firm*—Herbert L. Lerner; Laurence A. Greenberg; Werner H. Stemer

(57) ABSTRACT

A device for producing a silicon carbide (SiC) single crystal contains a crucible having a storage region for holding a stock of solid SiC and having a crystal region for holding a SiC seed crystal. An insert made from glassy carbon is disposed in the crucible. In the method, solid SiC is sublimed as a result of the stock being heated and SiC in the gas phase is generated, which is conveyed to the SiC seed crystal, on which it grows as an SiC single crystal. A heat flux is controlled by an insert made from glassy carbon.

14 Claims, 3 Drawing Sheets

DEVICE AND METHOD FOR PRODUCING AT LEAST ONE SIC SINGLE CRYSTAL

CROSS-REFERENCE TO RELATED APPLICATION

This is a continuation of copending International Application PCT/DE99/02066, filed Jul. 5, 1999, which designated the United States.

BACKGROUND OF THE INVENTION

1. Field of the Invention

The invention relates to a device and a method for producing at least one silicon carbide (SiC) single crystal. A device and a method of this type are known, for example, from International Patent Disclosure WO 94/23096 A1.

International Patent Disclosure WO 94/23096 A1 discloses a device and a method for producing an SiC single crystal which use the sublimation of SiC in solid form, for example of industrial-grade SiC in powder form, and the deposition of the SiC in a gas phase formed as a result of the sublimation on a single-crystalline SiC seed crystal. A reaction vessel in crucible form is used, which contains a storage region and a reaction region which are connected to one another by a gas duct. Alternatively, an additional homogenization region may be connected between the storage region and the reaction region, which homogenization region is likewise in communication with the storage region and the reaction region, in each case via a gas duct. The storage region contains the solid SiC, whereas the single-crystalline SiC seed crystal on which the SiC single crystal grows is disposed in the reaction region. In the document, embodiments in which a plurality of SiC single crystals are deposited on in each case associated SiC seed crystals are also described. In addition, various configurations of the storage regions are disclosed. Outside the reaction vessel there is a heater device which in particular may also be of a multi-part structure in accordance with the division of the reaction vessel into the storage region and the reaction region. The heater device heats the stock of solid SiC in the storage region to a temperature of from 2000° C. to 2500° C. As a result, the solid SiC is sublimed. The gas mixture which is formed in the process primarily contains the components Si (silicon), $Si_2C$, $SiC_2$ and SiC. The gas mixture is also referred to below as "SiC in the gas phase".

As a result of a temperature gradient being established between the stock of solid SiC and the SiC seed crystal or the SiC single crystal which has already grown, the sublimed gas mixture is conveyed from the storage region into the reaction region, in particular to the SiC seed crystal. In this case, the flow of the SiC in the gas phase is set in terms of its conveying rate and also its direction by the geometry of the gas duct.

The individual constituents of the reaction vessel preferably are formed of a high-purity electrographite. This is isostatically pressed graphite. These types of graphite are commercially available in various densities. They differ in terms of their relative density and different porosity. Even very highly pressed graphites still have a pore volume of at least 8 to 12%. The residual porosity is of importance for the silicon carbon growth, since the gases which are present during the silicon carbide growth, in particular the silicon-containing gases, penetrate into the pores, where they react with the graphite.

The article titled "Formation of Macrodefects in SiC", by R. A. Stein, Physica B, Vol. 185, 1993, pages 211 to 216, describes a phenomenon which relates to the reaction of solid SiC with the carbon in the graphite forming the vessel material. According to this, small pores or dislocations in the region of an interface between a base material made from graphite and an SiC seed crystal disposed thereon form the starting point initially for the formation and then also the subsequent growth of cavities in the SIC seed crystal. Under the conditions that prevail in the reaction vessel, these cavities extend beyond the seed crystal and also into the SiC single crystal to be produced. These cavities lead to a reduced quality of the SiC single crystal being produced.

As is known from International Patent Disclosure WO 94/23096 A1, material is conveyed from the stock of solid SiC to the SiC seed crystal as a result of a temperature gradient being established and a heat flux which forms as a result. When controlling heat fluxes in the crucible using parts or inserts made from graphite, the difficulties that have already been mentioned above occur again, on account of the reaction between the SiC in the gas phase and the graphite.

Published, Soviet Patent Application SU 882247 A1 discloses the use of tantalum as a suitable material for the crucible or at least for an insert inside the crucible. However, tantalum also reacts with SiC in the gas phase. In particular, carbides are formed, so that the dimensions of the device containing the tantalum change. For example, if tantalum thicknesses of several millimeters are provided, this may lead to mechanical stresses in the crucible.

U.S. Pat. No. 5,667,587 discloses a crucible for sublimation growth of an SiC single crystal, the inner walls of which crucible are coated with a thermally anisotropic coating. In particular, the coating is formed of pyrolitic graphite. The thermal anisotropy of the pyrolitic graphite in this case serves to control heat fluxes inside the crucible as referred to above. However, since the coating, just like the gas duct disclosed in International Patent Disclosure WO 94/23096 A1, is formed of a graphite material, it also has undesirable reactions with the SiC in the gas phase occur. In this context, it is irrelevant whether electrographite or pyrolitic graphite is used.

SUMMARY OF THE INVENTION

It is accordingly an object of the invention to provide a device and a method for producing at least one SiC single crystal, that overcome the above-mentioned disadvantages of the prior art devices and methods of this general type, which allow heat fluxes in the crucible to be controlled and, at the same time, avoid the undesirable reactions of the materials used in the prior art with solid SiC or also with SiC in the gas phase.

With the foregoing and other objects in view there is provided, in accordance with the invention, a device for producing at least one silicon carbide (SiC) single crystal. The device contains a crucible having at least one storage region for holding a stock of solid SiC and at least one crystal region for holding in each case one SiC seed crystal on which the SiC single crystal grows. A heater device is disposed outside the crucible, and at least one insert made from glassy carbon is disposed in the crucible.

With the foregoing and other objects in view there is also provided, in accordance with the invention, a method for producing at least one silicon carbide (SiC) single crystal. The method includes the steps of:

a) introducing a stock of solid SiC into at least one storage region of a crucible;

b) introducing at least one SiC seed crystal into the crucible;

c) providing at least one insert made from glassy carbon in the crucible for controlling heat flux;

d) heating the solid SiC such that the solid SiC is sublimed and results in SiC in a gas phase being generated; and e) conveying the SiC in the gas phase to the at least one SiC seed crystal, on which it grows forming the SiC single crystal.

The invention is based on the recognition that glassy carbon, on account of its excellent properties, is eminently suitable for use in a crucible that is used to produce SiC single crystals. Glassy carbon is an amorphous, isotropic material which has a melting point which lies considerably above the temperature of up to 2500° C. which is customarily employed during the production of SiC single crystals. Since, moreover, glassy carbon has a higher density and, with a pore volume of virtually 0%, a significantly lower porosity than all types of graphite, the glassy carbon also presents a considerably reduced tendency to react with both solid SiC and with SiC in the gas phase compared to graphite. Moreover, the thermal conductivity of glassy carbon is lower than that of graphite by a factor of approximately 10. For this reason, glassy carbon is a better thermal insulator than graphite. Therefore, heat fluxes in the crucible can be guided in specific directions by inserts made from glassy carbon.

On account of its high thermal insulating properties, glassy carbon fulfills the requirements for controlling heat fluxes inside the crucible. Furthermore, the tendency of glassy carbon to react with SiC is considerably lower, on account of its high density, than that of other materials used according to the prior art, such as for example different types of graphite.

A first preferred configuration provides for a specific control or guidance of a first heat flux. The first heat flux leads to the SiC in the gas phase being guided in a controlled manner onto a crystallization front at the SiC seed crystal or at the SiC single crystal which has already grown on. The first heat flux is now controlled in particular in such a way that, at least at the location of the crystallization front, i.e. at the point at which the crystal growth on the SiC seed crystal or the SiC single crystal which has already grown on is currently taking place, it has a uniform orientation (=parallel flux vectors) over its entire cross section. This property of the first heat flux is preferably already established within a zone which precedes the crystallization front. As a result, both a uniform temperature (=isothermal plane) and a uniform concentration of the SiC in the gas phase (=plane of identical material concentration) are established at the crystallization front itself. This has a beneficial effect with regard to homogeneous and flawless crystal growth.

In another advantageous embodiment, a hollow cylindrical gas duct made from glassy carbon is situated in the interior of the crucible and specifically between the storage region and the first crucible wall. The SiC seed crystal on which the SiC single crystal grows is positioned at an end of this gas duct that is remote from the storage region. On account of a temperature gradient which has been established, SiC in the gas phase which has sublimed out of the stock moves to an end of the gas duct which faces the storage region. A first heat flux forms through the gas duct, leading to the SiC in the gas phase being passed in a controlled manner to the crystallization front at the SiC seed crystal or at the SiC single crystal which has already grown on. On account of the good thermal insulation properties of the glassy carbon used for the gas duct, the focusing of the first heat flux and therefore also the conveying of the SiC in the gas phase take place particularly effectively. There are only slight heat losses through walls of the gas duct.

An embodiment in which a principal direction of the heat flux runs virtually parallel to a first center axis associated with the SiC single crystal is advantageous. The result is a particularly favorable planar or slightly convex growth phase boundary at the growing SiC single crystal. In this context, a virtually parallel orientation is considered to be present provided that the principal direction of the first heat flux and the first center axis associated with the SiC single crystal include an angle of less than 10°. Since the first heat flux is decisively controlled by the gas duct, its principal direction has practically the same orientation as a second center axis associated with the gas duct.

In another preferred variant of the device, the control of the first heat flux is improved as a result of a wall of the gas duct running along the second center axis being configured so that its wall thickness is not constant. The claimed improvements are achieved by a corresponding variation in the wall thickness along the second center axis. This is achieved in particular if the wall thickness increases constantly starting from the SiC seed crystal toward the storage region.

Preferred a wall thickness of the wall of the gas duct is between 0.1 and 5 mm. Glassy carbon can be produced to these thicknesses without problems.

In addition to the discussed embodiments with control of a first heat flux inside the crucible, it is also possible to provide embodiments in which heat fluxes between the interior and exterior of the crucible are controlled by the use of an insert made from glassy carbon.

An advantageous embodiment results if a first plate made from glassy carbon is disposed on a side of the SiC seed crystal which is remote from the SiC single crystal. In this case, the first plate fulfills a plurality of functions simultaneously. On account of the flexural strength of glassy carbon being three to four times higher than that of graphite, the first plate can be made significantly thinner than a corresponding plate of graphite. The result is easier dissipation of heat from the SiC seed crystal. To maintain the temperature gradient between the stock and the SiC seed crystal, it is necessary for heat to be dissipated at the SiC seed crystal. This takes place via the first plate.

A preferred thickness range for the first plate is between 0.1 and 2 mm. A plate thickness of 0.5 mm is particularly preferred.

A second very significant function of the first plate made from glassy carbon consists in avoiding undesirable reactions between the SiC seed crystal and the base. When the SiC seed crystal is applied to a base made from graphite, for example directly to a first crucible wall on an upper inner side of the crucible, the silicon carbide of the SiC seed crystal reacts with the carbon base. As a result, cavities are formed which also propagate inside the growing SiC single crystal, thus reducing the quality of the SiC single crystal produced. SiC single crystals of this type can no longer be used for all applications.

It has now been found that the application of the SiC seed crystal to a base of glassy carbon leads to a considerably improved quality of the SiC single crystal produced. The reason for this lies in the materials properties of glassy carbon. Glassy carbon is significantly less likely to react with the SiC of the SiC seed crystal. Since, therefore, there are no cavities formed at the interface between the SiC seed crystal and the first plate made from glassy carbon, the density of cavities in the SiC single crystal produced is also considerably reduced.

In addition, it is advantageous if the first plate has a polished surface facing toward the SiC seed crystal.

In another embodiment, the storage region is thermally insulated by a second plate of glassy carbon, which is situated at the bottom of the storage region. In particular, the second plate may simply be laid on top of a second crucible wall, which delimits the storage region at the bottom. The second plate made from glassy carbon therefore prevents heat loss in the storage region. In this advantageous embodiment, a third heat flux, which without the second plate would dissipate heat from the storage region and the crucible, is returned to the storage region. In this way, the thermal energy in the storage region is maintained and contributes here to the sublimation of the SiC.

In accordance with an added feature of the invention, there is the step of disposing the SiC seed crystal on a wall of the crucible which is spaced apart and lies opposite from the storage region.

In accordance with an additional feature of the invention, there is the step of controlling the heat flux, which conveys the SiC in the gas phase to the SiC seed crystal, in such a way that an isothermal plane and a plane of uniform concentration of the SiC in the gas phase are formed at least at one of a crystallization front of the SiC seed crystal and of the SiC single crystal which has already grown on.

In accordance with another feature of the invention, there is the step of controlling the heat flux, which conveys the SiC in the gas phase to the SiC seed crystal, by use of the insert made from the glassy carbon in a form of a hollow cylindrical gas duct.

In accordance with a further feature of the invention, there is the step of setting the heat flux with a principal direction which is oriented virtually parallel to a first center axis associated with the SiC single crystal to be produced.

In accordance with another added mode of the invention, there is the step of controlling a further heat flux, which leads to dissipation of heat at the SiC seed crystal, by a plate formed from the glassy carbon and disposed between the SiC seed crystal and a wall of the crucible.

In accordance with a concomitant feature of the invention, there is the step of controlling an additional heat flux, which leads to thermal insulation of the stock, using a further plate made from the glassy carbon and disposed between the stock and a further wall of the crucible.

Other features which are considered as characteristic for the invention are set forth in the appended claims.

Although the invention is illustrated and described herein as embodied in a device and a method for producing at least one SiC single crystal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
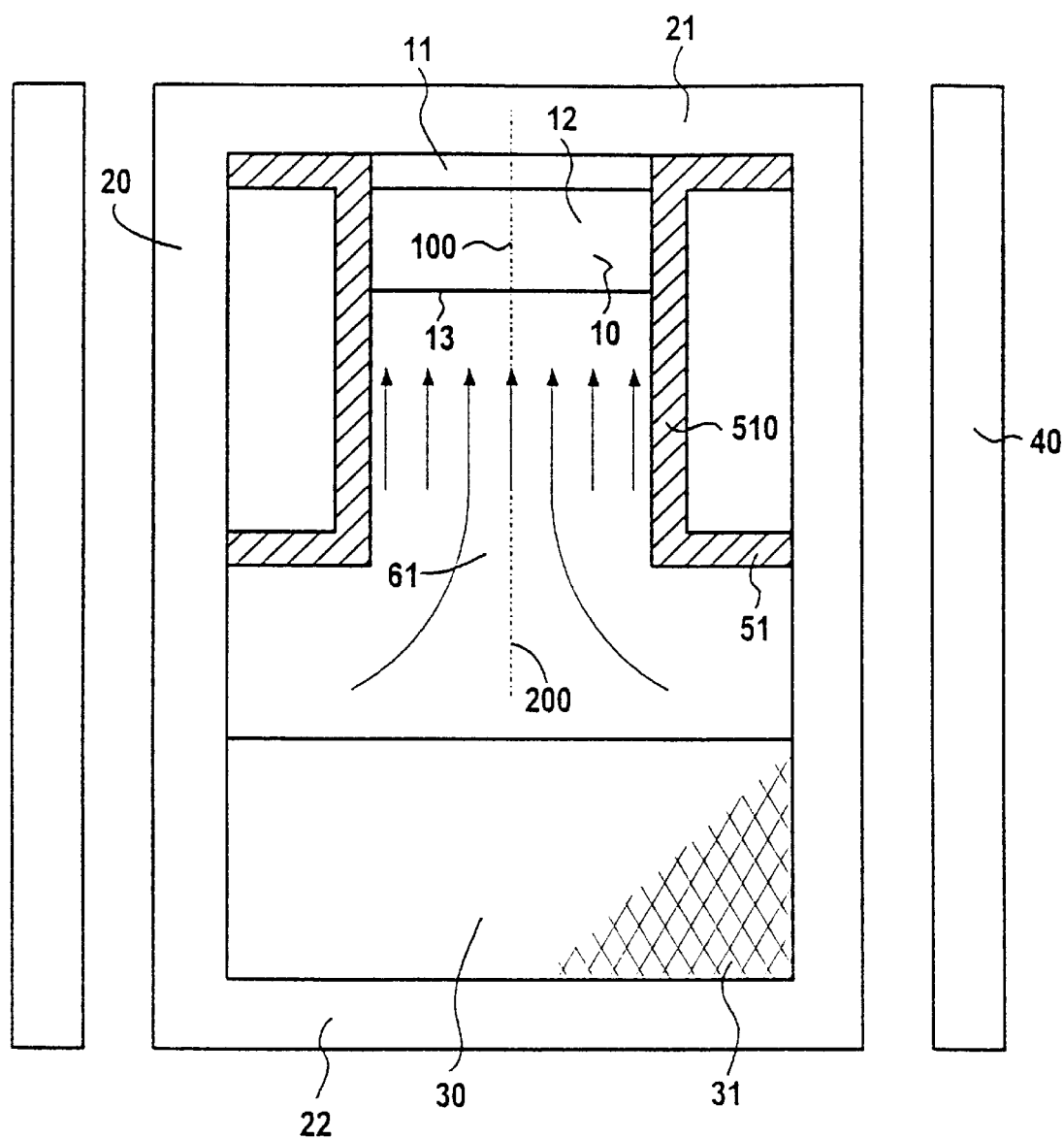
FIG. 1 is a diagrammatic, sectional view of a device for producing an SiC single crystal, and having a gas duct made from glassy carbon according to the invention.

In all the figures of the drawing, sub-features and integral parts that correspond to one another bear the same reference symbol in each case. Referring now to the figures of the drawing in detail and first, particularly, to FIG. 1 thereof, there is shown a device used to produce an SiC single crystal 10 in a crucible 20. The crucible 20 contains a storage region 30 and a crystal region 12, which adjoin respectively opposite crucible walls. The crystal region 12 adjoins an upper, first crucible wall 21, and the storage region 30 adjoins a lower, second crucible wall 22. The storage region 30 is intended to hold a stock 31 of solid silicon carbide, in particular in the form of SiC powder. In the crystal region 12, an SiC seed crystal 11, which is formed of single-crystalline silicon carbide, is disposed on the first crucible wall 21. A side of the seed crystal 11 which lies opposite the first crucible wall 21 serves as a growth area for the SiC single crystal 10.

The stock 31 of solid SiC which is situated in the storage region 30 is heated to a temperature of between 2300° C. and 2500° C. by a heater device 40 disposed outside the crucible 20. As a result, the solid SiC in the stock 31 is sublimed. In the present case, the heater device 40 is an inductive heater coil. However, resistance heating is also possible. On account of a temperature gradient which is established between the stock 31 and the SiC seed crystal 11, the SiC in the gas phase which is then present is conveyed to the SiC single crystal 10, where the SiC in the gas phase is deposited, at a crystallization front 13, as single-crystalline SiC.

To further increase the yield during the growth of the SiC single crystal 10, a hollow cylindrical gas duct 51 is disposed in the crucible 20. The gas duct 51 is used to focus a first heat flux 61, which emanates from the stock 31, onto the SiC seed crystal 11. The focusing of the first heat flux 61 also leads to concentration of the entrained SiC in the gas phase, so that the highest possible proportion of the SiC which has been sublimed out of the stock 31 actually reaches the SiC seed crystal 11 or the SiC single crystal 10 which has already grown, where it can contribute to the (further) growth of the SiC single crystal 10. On account of the improved thermal insulating properties, the gas duct 51 formed of glassy carbon provides more effective guidance and control of the heat flux 61 than a similar gas duct made from graphite. Furthermore, the glassy carbon used offers the advantage of being substantially resistant to the SiC in the gas phase. Compared to graphite, glassy carbon is significantly less likely to react with both solid SiC and SiC in the gas phase.

The low tendency of solid SiC to react with glassy carbon also explains the ease of crystal removal after growth is complete. The gas duct 51 formed of glassy carbon completely surrounds the crystal region 12 in which the crystal growth of the SiC single crystal takes place. Since, for the reasons mentioned above, there is no reaction with a wall 510 of the gas duct 51 and the SiC single crystal 10 which has been grown in particular does not grow onto the wall 510, the SiC single crystal 10 can be removed without problems after the growth operation has finished.

On account of the features of the crucible 20, a first center axis 100 of the SiC single crystal 10 is oriented exactly parallel to a second center axis 200 of the gas duct 51. Since the second center axis 200 also coincides with a principal direction of the heat flux 61, the heat flux 61 is therefore likewise oriented parallel to the first center axis 100 of the SiC single crystal 10. Moreover, the gas duct 51 leads to the first heat flux 61 running almost completely parallel within a zone that precedes the crystallization front 13. The result is a planar or slightly convex crystallization front 13 on the SiC single crystal 10 and particularly favorable crystal growth.

Control of the heat flux 61 in accordance with the device shown in FIG. 1 allows a substantially stress-free SiC single crystal 10 to be grown, and the crystal consequently also has a very low dislocation density.

In a variant which is not shown, the glassy carbon of the gas duct 51 may additionally have a thin coating of a material with a high melting point, such as tantalum, niobium, tungsten, osmium, iridium, rhenium or a carbide of one of these materials.

In this way the thermal and chemical behavior can be improved further.

The thickness of the glassy carbon that is used for the wall 510 of the gas duct 51 is approximately 0.5 mm.

Figure 2:
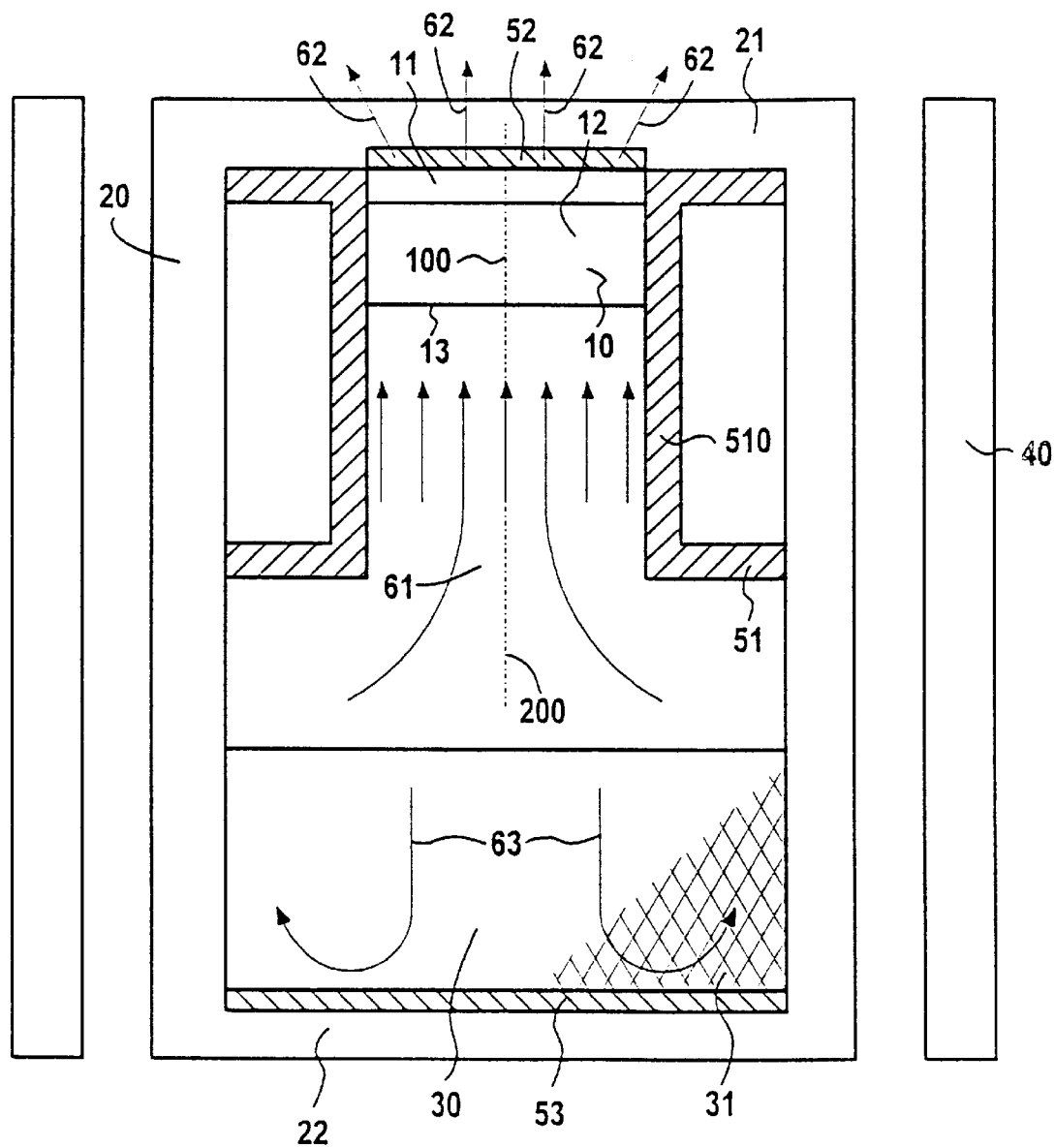
FIG. 2 is a sectional view of a further device for producing the SiC single crystal, and having a plurality of inserts made from glassy carbon in a crucible.

FIG. 2 shows a further device for producing the SiC single crystal 10. Unlike the device shown in FIG. 1, the device shown in FIG. 2 contains further inserts made from glassy carbon. These inserts include a first plate 52 made from glassy carbon, which is situated between the SiC seed crystal 11 and the first crucible wall 21. Moreover, a second plate 53, likewise made from glassy carbon, is disposed at the bottom of the storage region 30, on the second crucible wall 22.

The first plate 52 is also used to dissipate heat from the SiC seed crystal into an outer region of the crucible 20. In the exemplary embodiment illustrated in FIG. 2, the first plate 52 is for this purpose situated in a recess in the first crucible wall 21. Since glassy carbon inherently has good thermal insulation properties, the first plate 52 is of a very thin construction, in order that a sufficient second heat flux 62 into the outer region can nevertheless be ensured.

Therefore, the thickness of the first plate 52 is approximately 0.5 mm.

In an embodiment which is not illustrated, the dissipation of heat is increased further as a result of that surface of the first plate 52 which is remote from the SiC seed crystal 11 being roughened, thus increasing the emission coefficient. With graphite, this possibility of increasing the emission coefficient by roughening does not exist, unlike with the glassy carbon used in the present invention.

A second function of the first plate 52 is to prevent the formation of cavities in the SiC seed crystal 11. These cavities would then grow through the seed crystal 11 into the single crystal 10. On account of the low tendency of glassy carbon to react with the solid SiC of the SiC seed crystal 11, the formation of cavities of this type is suppressed from the outset.

The surface of the first plate 52 that faces toward the SiC seed crystal 11 is additionally polished. As a result, cavities at the interface between the SiC seed crystal 11 and the first plate 52 are avoided, which cavities could otherwise form even before the actual growing process starts simply on account of excessive surface roughness.

The second plate 53 is used for thermal insulation of the storage region 30. At this point, it is desirable for the thermal energy to be kept as far as possible in the storage region 30, in order to maintain the sublimation of SiC. The second plate 53 made from glassy carbon contributes to this to the extent that a third heat flux 63, which is directed into the outer region, is returned into the storage region at the second plate 53.

Figure 3:
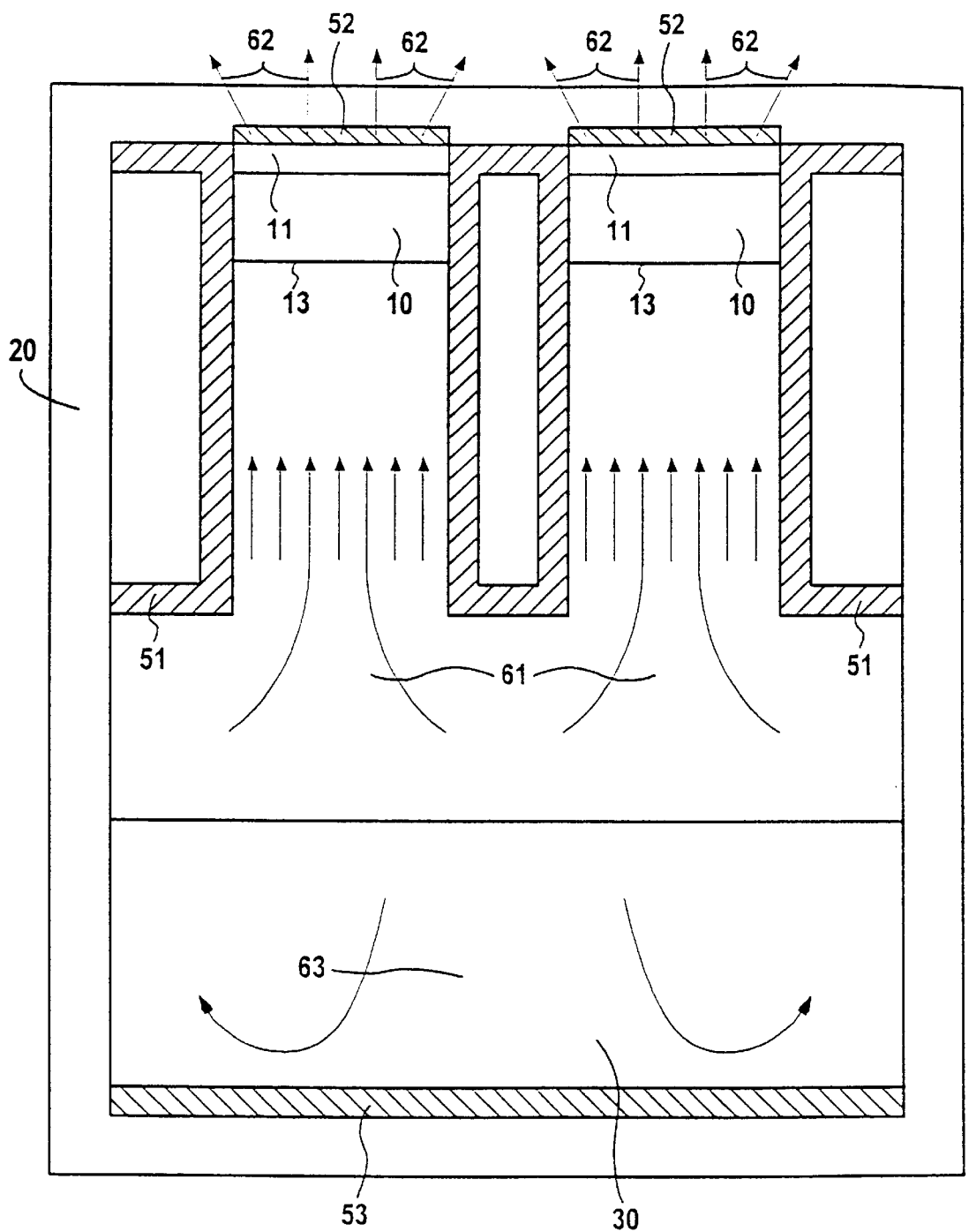
FIG. 3 is a sectional view of the crucible for producing two SiC single crystals, and having a plurality of the inserts made from glassy carbon.

FIG. 3 shows a crucible 20 that is intended for the production of two SiC single crystals 10. The crucible 20 also contains in its interior a plurality of inserts made from glassy carbon, which correspond to those which have been discussed in connection with FIG. 2. The exemplary embodiment shown in FIG. 3 contains two separate gas ducts 51 and two SiC seed crystals 11, onto each of which one SiC single crystal 10 grows. In an embodiment that is not shown, two separate storage regions are provided instead of the one storage region 30.

Preferred modifications of the SiC single crystal 10 produced are 4H-, 6H- and 15R-SiC. The SiC seed crystal 11 preferably also consists of one of these SiC polytypes.

All substances that are suitably heat-resistant are possible materials for the crucible 20; high-purity electrographite is particularly suitable.

We claim:

1. A device for producing at least one silicon carbide (SiC) single crystal, comprising:
   a crucible having at least one storage region for holding a stock of solid SiC and at least one crystal region for holding in each case one SiC seed crystal on which the SiC single crystal grows;
   a heater device disposed outside said crucible; and
   at least one insert made from glassy carbon disposed in said crucible.

2. The device according to claim 1, wherein said crucible has a crucible wall spaced apart from and disposed opposite of said storage region, and said crystal region adjoins said crucible wall.

3. The device according to claim 2, wherein said crucible is formed from graphite.

4. The device according to claim 3, wherein said insert, made from said glassy carbon, is a hollow cylindrical gas duct disposed between said storage region and said crucible wall.

5. The device according to claim 4, wherein a first center axis, which is associated with the SiC single crystal to be produced, and a second center axis, which is associated with said hollow cylindrical gas duct, are oriented virtually parallel to one another.

6. The device according to claim 5, wherein said hollow cylindrical gas duct has a wall running along said second center axis and has a varying wall thickness formed from said glassy carbon.

7. The device according to claim 4, wherein said hollow cylindrical gas duct contains a wall having a thickness of between 0.1 mm and 5 mm.

8. The device according to claim 2, including a plate made from said glassy carbon and disposed between the SiC seed crystal and said crucible wall.

9. The device according to claim 8, wherein said plate has a thickness of between 0.1 mm and 2 mm.

10. The device according to claim 8, wherein said plate has a polished surface facing toward the SiC seed crystal.

11. The device according to claim 8, wherein said crucible has a further wall, and including a further plate made of said glassy carbon and disposed in said storage region on said further crucible wall, said further wall delimits a bottom of said storage region.

12. The device according to claim 11, wherein said further plate has a thickness of between 0.1 mm and 5 mm.

13. The device according to claim 8, wherein said plate is 0.5 mm thick.

14. The device according to claim 11, wherein said further plate has a thickness of between 2 mm and 5 mm.

* * * * *